United States Patent [19]
Gardner et al.

[11] Patent Number: 6,165,858
[45] Date of Patent: Dec. 26, 2000

[54] ENHANCED SILICIDATION FORMATION FOR HIGH SPEED MOS DEVICE BY JUNCTION GRADING WITH DUAL IMPLANT DOPANT SPECIES

[75] Inventors: Mark I. Gardner, Cedar Creek; Fred N. Hause, Austin; Jon C. Cheek, Round Rock, all of Tex.

[73] Assignee: Advanced Micro Devices, Sunnyvale, Calif.

[21] Appl. No.: 09/200,143

[22] Filed: Nov. 25, 1998

[51] Int. Cl.$^7$ ................................................ H01L 21/336
[52] U.S. Cl. ..................... 438/305; 438/307; 438/526; 438/682
[58] Field of Search ..................... 438/299, 301, 438/303, 305 T, 306, 307, 526, 682

[56] References Cited

U.S. PATENT DOCUMENTS

| | | | |
|---|---|---|---|
| 5,607,884 | 3/1997 | Wu | 438/233 |
| 5,770,507 | 6/1998 | Chen et al. | 438/305 |
| 5,780,347 | 7/1998 | Kapoor | 438/301 |
| 5,891,785 | 4/1999 | Chang | 438/305 |
| 6,001,676 | 12/1999 | Sawada et al. | 438/202 |
| 6,025,241 | 2/2000 | Lin et al. | 438/303 |

*Primary Examiner*—Long Pham
*Attorney, Agent, or Firm*—Bruce Garlick; James Harrison

[57] ABSTRACT

A method of making a MOS transistors in an integrated circuit includes forming a plurality of doped source and drain regions adjacent respective gate structures that include gate dielectrics, gate conductors and spacers. The plurality of doped source and drain regions are formed at different depths, at different doses and with differing dopants. In one embodiment, first doped source and drain regions are formed at a first depth, at a first dose using a first dopant while second doped source and drain regions are formed at a second depth, at a second dose using a second dopant. The first depth is shallower than the second depth so that the first doped source and drain regions serve as sacrificial doped regions that are consumed in a silicidation process when they are converted into a silicide by being combined with a silicidation metal. However, the second doped source and drain regions maintain their doping profiles and dopant levels. The implant energy of the dopants depends upon their molecular weight and desired doping depths. The dose of such doping depends upon desired drive current and other characteristics of the transistors.

21 Claims, 6 Drawing Sheets

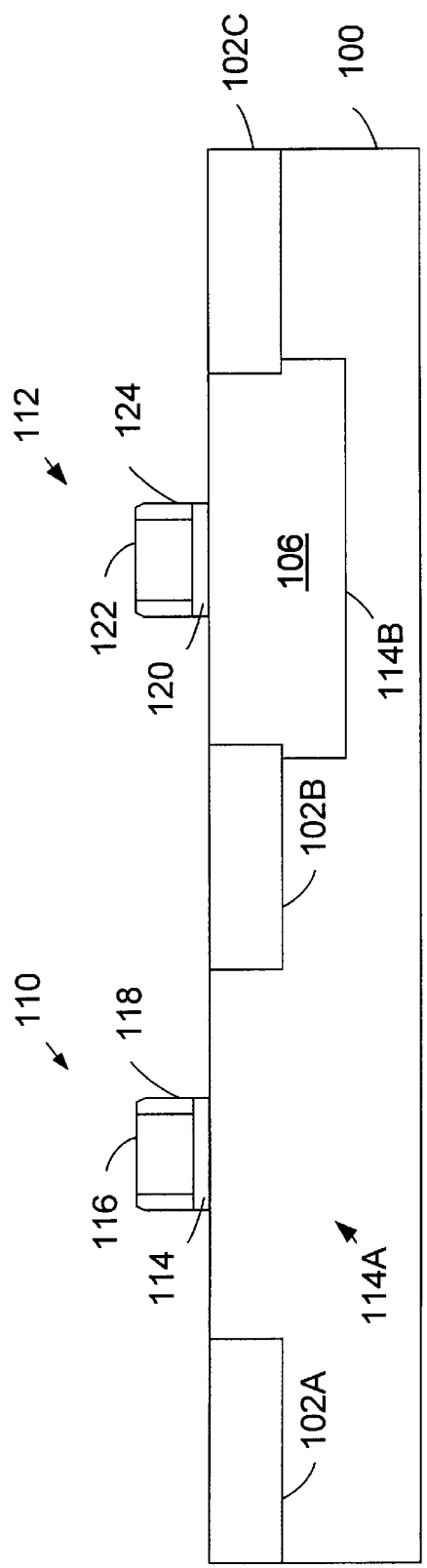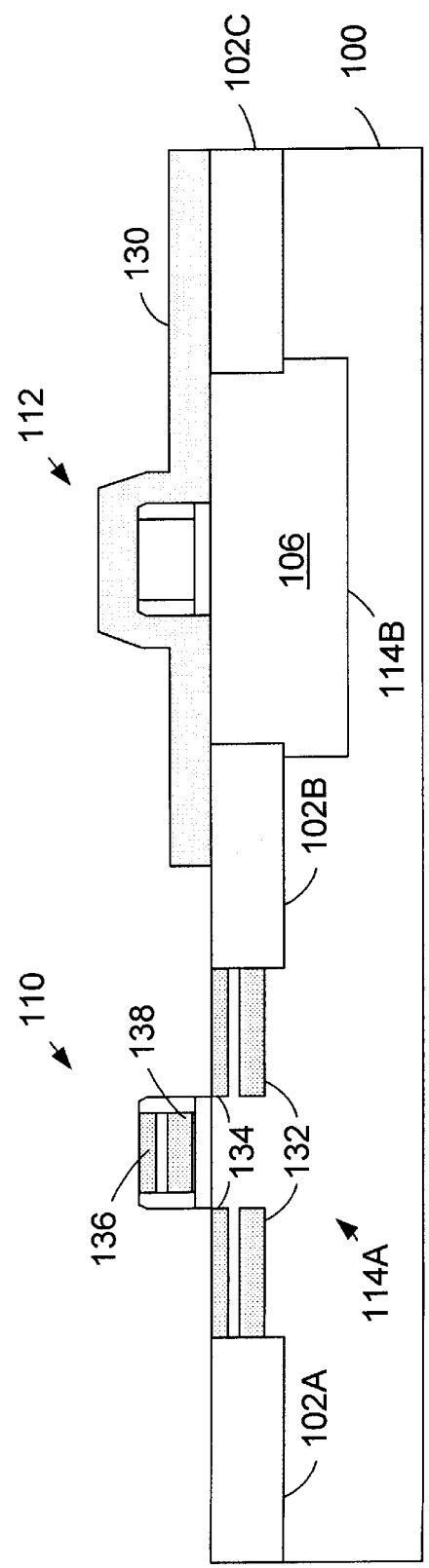

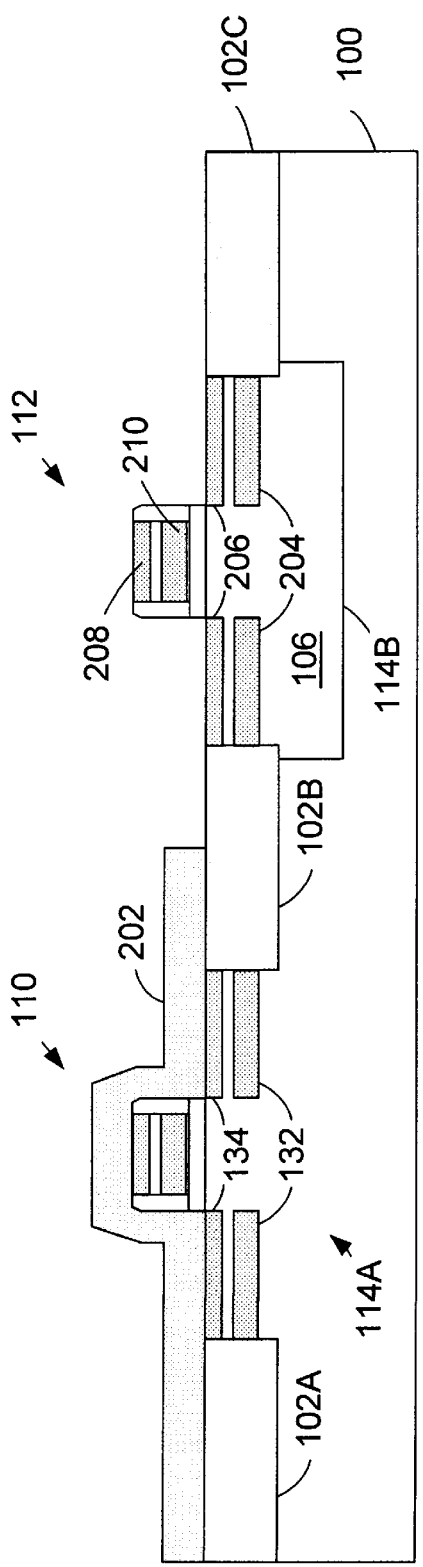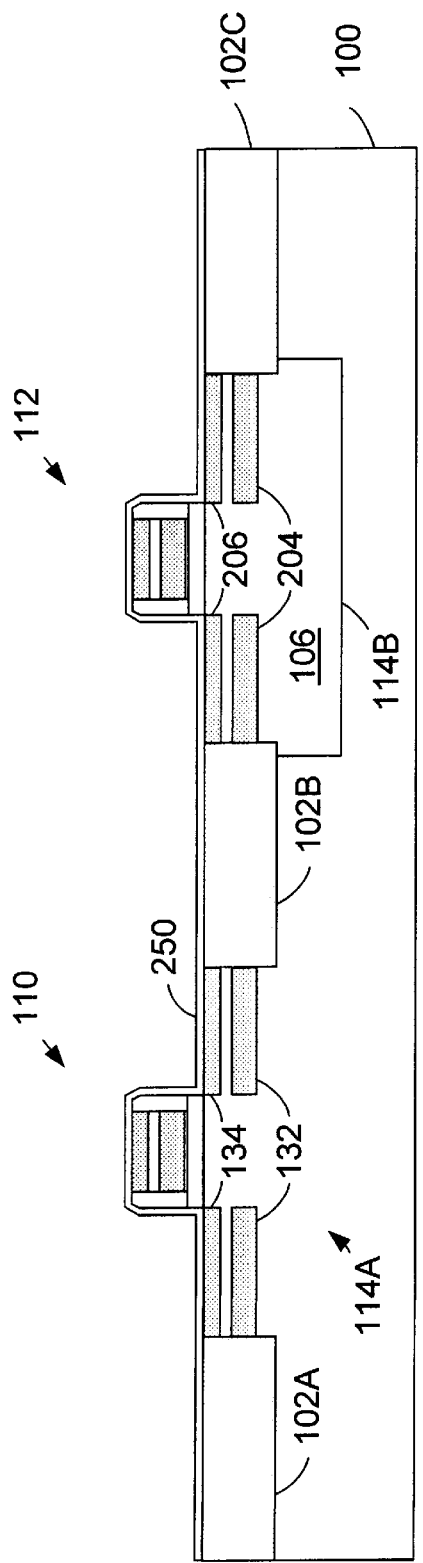

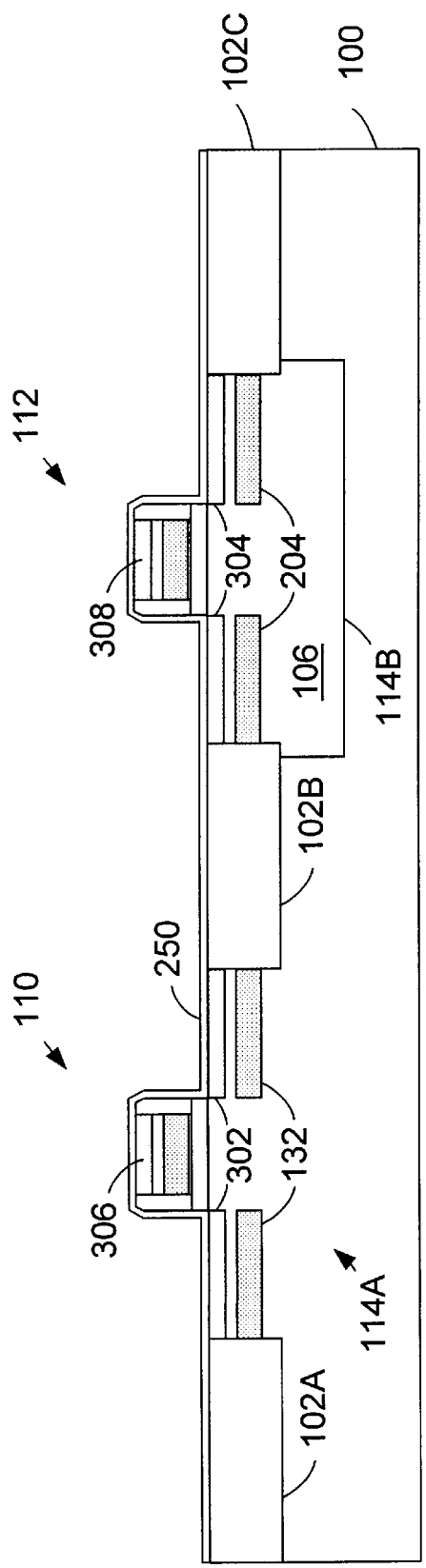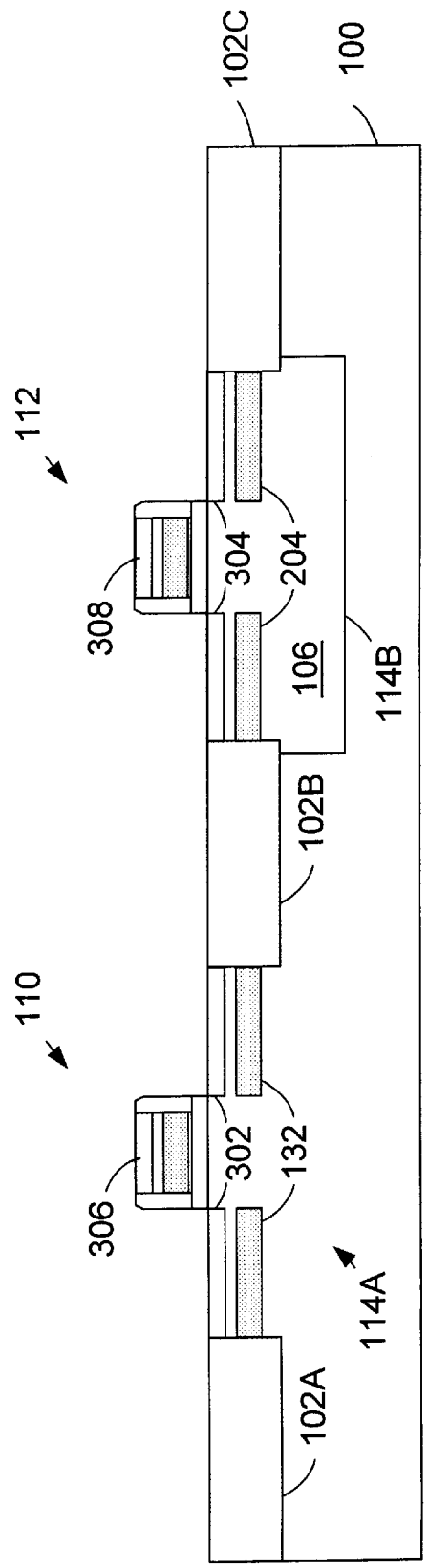

ENHANCED SILICIDATION FORMATION FOR HIGH SPEED MOS DEVICE BY JUNCTION GRADING WITH DUAL IMPLANT DOPANT SPECIES

BACKGROUND

1. Field of the Invention

The present invention relates generally to integrated circuit manufacture, and more particularly, to a method of manufacture and a structure in which a shallow junction CMOS device is formed in a semiconductor substrate.

2. Description of the Related Art

The structure and the various components, or features, of metal oxide semiconductor (MOS) devices are generally well known. A MOS transistor typically includes a substrate material onto which a gate dielectric and a patterned gate conductor are formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS transistor employs n-type junctions placed into a p-type substrate. Conversely, a typical p-channel MOS transistor comprises p-type junctions placed into an n-type substrate. The substrate comprises an entire monolithic silicon wafer, of which, a portion of the substrate known as a "well" exists. The well is doped opposite the substrate so that it can accommodate junctions of an impurity type opposite the junction in the non-well areas. Accordingly, wells are often employed when both n-type and p-channel transistors (e.g., Complementary MOS, "CMOS") are needed.

A common trend in modern integrated circuit manufacture is to produce transistors having feature sizes as small as possible. To achieve a high density integrated circuit, features such as the gate conductors, source/drain junctions, and interconnects to the junctions must be made as small as possible. Many modern day processes employ features which have less than 0.20 microns critical dimensions. As feature sizes decrease, the size of the resulting transistors as well as the interconnects between transistors also decrease. Smaller transistor size allows more transistors to be placed on a single monolithic substrate, thereby allowing relatively large circuit systems to be incorporated on a single and relatively small die area. Further, smaller transistors typically have lower turn-on threshold voltages, faster switching speeds and consume less power in their operation. These features in combination allow for higher speed integrated circuits to be constructed that have greater processing capabilities and that produce lesser heat.

The benefits of high density circuits can only be realized if advanced processing techniques are used. For example, semiconductor process engineers and researchers often study the benefits of electron beam lithography and x-ray lithography to achieve the higher resolutions needed for submicron features. To some extent, wet etch has given way to a more advanced anisotropic (dry etch) technique. Further, suicides and polycides have replaced higher resistivity contact structures mostly due to the lower resistivity needed when a smaller contact area is encountered.

Many other techniques are often used to achieve a higher density circuit. However, these techniques must contend with problems resulting from higher density itself. Even the most advanced processing techniques cannot, in all instances, offset the problems associated with small features or features arranged extremely close to one another. For example, as the channel length decreases, short channel effects ("SCE") generally occur. SCE cause threshold voltage skews at the channel edges as well as excessive sub-threshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric fields give rise to so called hot carriers and the injection of these carriers into the gate oxide which resides between the substrate (or well) and the overlying gate conductor. Injection of hot carriers should be avoided since these carriers can become trapped and skew the turn-on threshold voltage of the ensuing transistor. In view of these considerations, certain scaling limits are being realized. Unfortunately, however, there continues to exist a need to further reduce device scaling.

An integrated circuit is, by definition, a number of electrically interconnected circuit elements defined on the same substrate or "chip". Some of the interconnections are done in the silicon substrate itself, but most are done by means of thin conductive strips running across the top surface of the substrate. Each strip is often connected within a contact area to underlying semiconductor materials (often referred to as "junctions"). Contact to junctions must be of low resistivity. For example, the contact junctions should have resistivity that is as low as a few micro ohms per square centimeter of contact area. The conductive strips are usually made of a metal such as aluminum or an aluminum alloy, and, in some instances, can have silicon placed therein. Aluminum adheres well to silicon dioxide and has low contact resistance, but may suffer numerous problems, such as, for example, a propensity to grow "spikes".

In ultra-shallow regions (i.e., junctions having a thickness less than, for example, 1,000 angstroms), aluminum may spike completely through the underlying junction at the contact area. To prevent spiking, the contact structure must be altered with, for example, a sacrificial, passive or stuffed barrier material. The barrier material resides between the aluminum and underlying silicon. A popular barrier comprises titanium nitride, wherein the nitride stuffs the grain boundaries of the titanium thereby preventing a substantial amount of silicon diffusion into the overlying aluminum from the junction region. As the junction region becomes shallower in accordance with modern day technologies, a barrier typically remains configured between the underlying silicon and overlying aluminum. However, the barrier must be formed in a low-temperature ambient so as to not further deepen the shallow junction region.

Along with barrier materials, the contact structures further include steps for lowering the contact resistance at the interconnect/silicon juncture. Specifically, most manufactures utilize a silicide formed at the juncture. The silicide helps break through the residual surface oxide so that good electrical contact can be made. Applying heat necessary for silicidation is sometimes required to adjust the silicon dioxide-silicon interface states. Silicides are made by depositing a thin layer of metal over the entire wafer, heating the wafer to a high enough temperature for the silicon and metal to react in the contact window areas and then etching away the unreacted metal on top of the oxide. Most metals used to form silicide are transition or refractory metals in group IV(B), V(B) and VI(B).

By depositing a refractory metal across the wafer and then heating it, the metal reacts with underlying silicon to form a silicide. Simultaneously, nitrogen atoms are inserted into the upper surface of the metal to provide barrier functionality. For this reason, metals that provide suitable properties for both silicide and barrier formation in a single anneal step are preferable. Unfortunately, the advent of ultra-shallow junctions has lead to many constraints on the silicidation process steps.

First, conventional silicidation processes require an anneal greater than approximately 800 degrees Celsius to form the silicide. Any temperature less than 800 degrees Celsius can produce a non-stoichiometric silicide leading to greater sheet resistance in the contact area. However, at more suitable silicide temperatures approaching 800 degrees Celsius, highly mobile boron dopants within the junction diffuse at greater diffusion lengths causing a deepening of the junction. Deepening of the junction can result in greater parasitic source/drain capacitance and lower breakdown voltages. Additionally, driving away of boron impurities from the surface area to deeper positions can increase the contact and sheet resistance in the contact area. Still further, increased heat can cause boron to diffuse along with silicon atoms into the growing silicide and further deplete boron at the silicon surface (adjacent the lower edge of silicide). Boron depletion caused by high temperature processing or by silicide-induced consumption must be minimized.

It is also important that the silicide be grown to a controlled thickness. If the silicide film becomes too thick, defects can occur at the edge of the silicide film due to stresses in the film. Such defects are reported to begin occurring once the thickness of the silicide film exceeds approximately 100 nanometers. The mechanism for growing silicide is generally understood as species of silicon diffusing from the underlying substrate surface to the overlying (and abutting) silicidation metal. If an excessive amount of silicon atoms are allowed to diffuse, then the silicide is made too thick causing undo stresses in the film. It is therefore important not only to minimize the silicide growth temperature, but also to prevent excessive silicon consumption during the growth process. It is important that the integrity of the boron atoms, once placed, remain in their position to maintain the ultra-shallow junction region and the advantages thereof.

Along these lines, an entire doped region, for example, a source or a drain, can become converted to a silicide thereby ruining the device. Thus, there exists a need in the art for better methods of forming devices that have shorter channels and more particularly, there exists a need to form shallow devices having been subjected to a silicidation step whose doped regions are not excessively converted to a silicide.

SUMMARY OF THE INVENTION

The problems outlined above are in large part solved by the transistor formation process according to the present invention in which new approaches are utilized to create a device having shallow junctions with integrated silicidation portions. The shallow junctions with the integrated silicidation portions are formed in a multi-stage process in which multiple doping steps are performed to first create shallow junctions with multiple doping profiles. Then, in a subsequent step, an upper doping profile is converted to a silicide to create a low resistance silicidation layer.

More specifically, a method of forming a MOS transistor doping process in which a plurality of doped regions are created at a plurality of depths. Thereafter, a silicidation metal is formed on top of the substrate. The silicidation metal is then combined with the shallow doped region(s) to form a controlled depth silicide(s). Resultantly, the deeper doped region(s) remains and functions as the source or drain implant region of the MOS device. Resultantly, the formed MOS device operates in a designed fashion, producing a designed drive current.

These and other aspects of the present invention will become apparent with further reference to the drawings and specification which follow.

BRIEF DESCRIPTION OF THE DRAWINGS

A better understanding of the present invention can be obtained when the following detailed description of the described embodiments is considered in conjunction with the following drawings, in which:

FIGS. 1A and 1B are partial cross-sectional views of a semiconductor substrate illustrating the formation of transistors according to the present invention;

FIGS. 2A and 2B are partial cross sectional views of the semiconductor substrate of FIGS. 1A and 1B illustrating the formation of the transistors during subsequent formation steps;

FIGS. 3A and 3B are partial cross sectional views of the semiconductor substrate of FIGS. 2A and 2B illustrating the formation of the transistors during further steps according to the present invention;

DETAILED DESCRIPTION OF THE DRAWINGS

Figure 4:
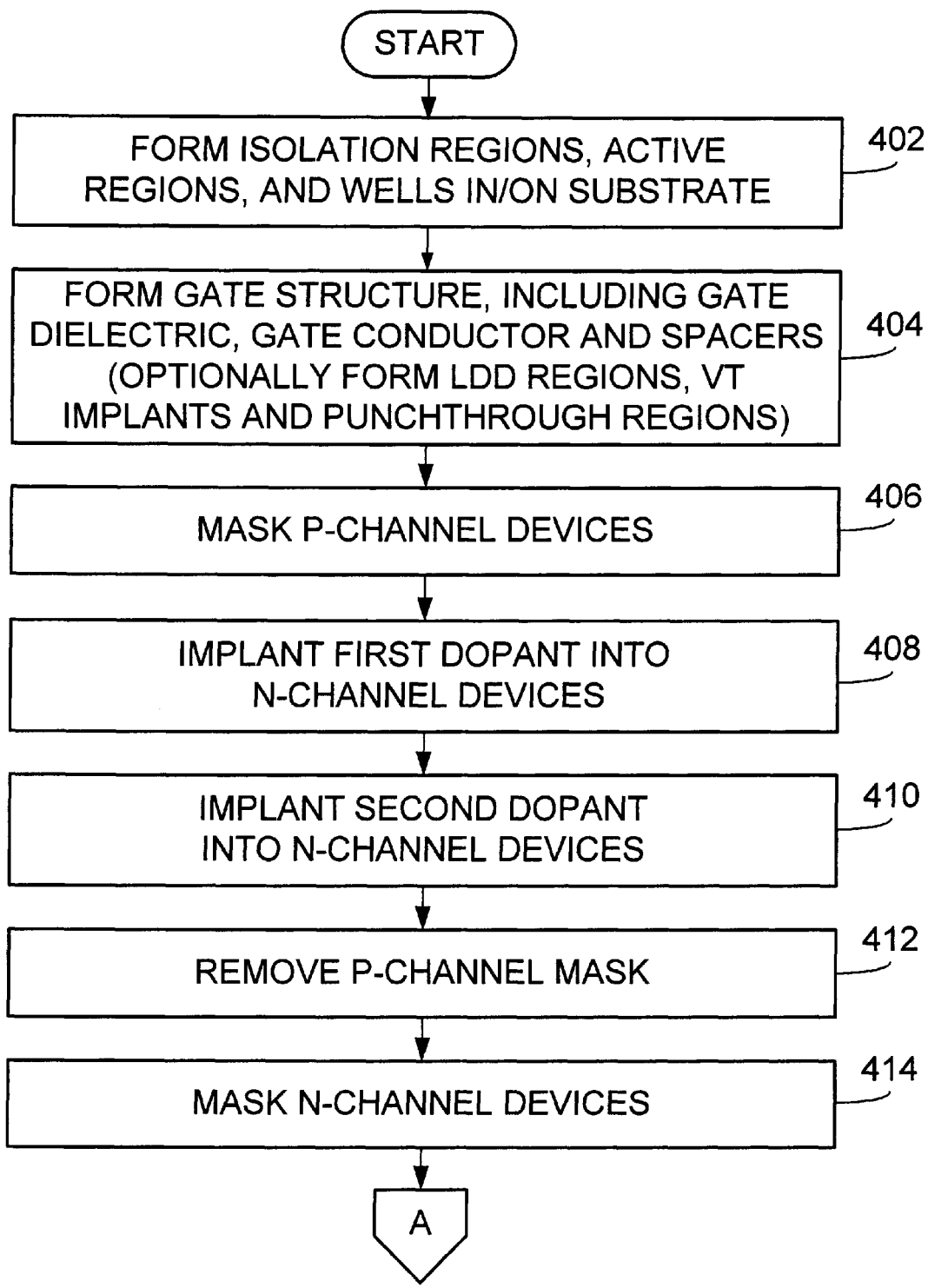
FIG. 4 is a flow chart illustrating a first series of steps of a method for forming a transistor upon a semiconductor substrate according to the present invention.

FIGS. 1A and 1B are partial cross-sectional views of a semiconductor substrate illustrating the formation of CMOS transistors according to the present invention. Referring now to FIG. 1A, a p-type substrate 100 includes a plurality of isolation regions 102A, 102B and 102C and active regions 104A and 104B. In general, FIG. 1A represents a substrate after a first set of steps of the integrated circuit fabrication process as described herein is performed. The active regions 104A and 104B are semiconductive regions in which active devices are formed. The isolation regions 102A, 102B and 102C are formed of an insulating material that serves to isolate active devices or conductive components from other active devices or conductive components. For silicon based semiconductor circuits, the isolation regions 102A, 102B and 102C are typically formed of silicon dioxide.

As is known by those skilled in the art, silicon dioxide has many uses and integrated circuits. It is used as insulation between polysilicon and metal layers, between metal layers in multilevel metal systems, as a getter, as a die fusion source, as a type using/implant mask, as a capping layer to prevent out diffusion and as a final passivation layer. As shown herein FIG. 1A, the silicon dioxide is being used to form the isolation regions 102A, 102B and 102C. The isolation regions 102A, 102B and 102C may be formed using the well known LOCOS growth process, trenching and filling steps or another isolation process. In general, the invention herein includes all forms of creating isolation regions. In at least one embodiment of the invention, the active region, which is formed between the isolation regions, is shielded by a mask and remains protected during formation of isolation regions 102A, 102B and 102C.

Continuing to refer to FIG. 1A, it may be seen that substrate 100 includes a well 106 (active region 104B) formed there within that is located between isolation regions 102B and 102C and forms the active region 104B. As may be seen, therefore, active region 104A is formed between isolation regions 102A and 102B. As may be seen, active regions 104A and 104B are complementary in type. In general, complementary active regions are created during the formation of complementary metal oxide semiconductor (CMOS) field effect transistors. By way of example, substrate 100 in FIG. 1A is formed of a p-type material while well 106 is doped to form an n-type material. Alternatively, in another embodiment, substrate 100 is formed of an n-type material while well 106 is doped to become a p-type material.

Continuing to refer to FIG. 1A, it may also be seen that two gate structures 110 and 112 have been formed on top of substrate 100. The gate structures 110 and 112 are formed upon the two active regions, 104A and 104B, respectively. As substrate 100 is formed of p-type material, an n-channel device will be subsequently formed in the active region 104A. Accordingly, a p-channel device will be formed in the active region 104B (well 106). As may be seen, gate structure 110 includes a gate dielectric 114, a gate conductor 116, and spacers 118. Similarly, gate structure 112 includes a gate dielectric 120, the gate conductor 122, and spacers 124.

While not specifically shown in FIG. 1A, it is understood that other structures may be formed on and/or within substrate 100. For example, Vt implants or LDD regions may be formed below be gate conductors or below the spacers, respectively. Additionally, punch through regions may be formed across the active regions 104A and 104B. Vt implants, LDD regions, and punch through regions are not shown herein for the sake of simplicity. One skilled in the art, however, can readily appreciate and understand the inclusion of these structures without additional explanation.

Referring now to FIG. 1B, a photo mask 130 is formed over the right hand portion of substrate 100 shown in FIG. 1B. More specifically, photo mask 130 is formed over a portion of the center isolation region 102B, well 106, gate structure 112, and isolation region 102C. The purpose of the photo mask 130 is to shield the right hand portion of substrate 100 shown herein FIG. 1B while processing steps are performed for the n-channel device on the left-hand side of substrate 100. It is understood, of course, that FIG. 1B merely illustrates the formation of one CMOS pair. In a substrate containing many CMOS pairs, a photo mask 130 is placed over all the p-channel devices while the n-channel devices are being formed.

The formation of patterned photo masks is well known in the art. In the described embodiment, the patterned mask 130 is formed by depositing a photoresist across the exposed surface of the substrate 100. Thereafter, the photoresist is selectively exposed in a photolithography step to expose the portions of the photoresist above the n-channel devices. Then, the exposed portions of the photoresist are stripped in an ashing or another removal process. Of course, photo mask 130 may be formed using other techniques as well.

Continuing to refer to FIG. 1B, it may be seen that a first dopant has been implanted into the n-channel device in the active region 104A and the gate conductor 116 to form doped portions 132 in the active region and a doped portion 138 in the gate conductor. Additionally, a second dopant has been implanted in the active region and the gate conductor to form doped portions 134 in the active region and a doped portion 136 in the gate conductor. While the doped portions 132 and 134 are shown to be separated for illustrative purposes, the doped portions 132 and 134 are not required to be separate and actually adjoin one another in some embodiments. In such cases, the doped portions 132 and 134 would adjoin one another within the active region 114A. In the same fashion, doped portions 136 and 138 may also adjoin one another.

There are several different embodiments of the doping levels and types according to the present invention. In the first embodiment, antimony is implanted with an energy level of 5–15 keV with a dose of $1 \times 10^{13}$ to $10 \times 10^{14}$ ions/cm$^2$. This implant step forms shallow doped portions 134 and doped portion 136 of FIG. 1B. Additionally, in the first embodiment, arsenic is implanted with an energy level of 10–60 keV and a dose of $2 \times 10^{15}$ to $8 \times 10^{15}$ ions/cm$^2$ to form doped portions 132 and doped portion 138 of FIG. 1B.

In a second embodiment of the invention, arsenic is used as the shallow dopant with a high dose. More specifically, arsenic is implanted with an implant energy of 5–15 keV and with a dose of $2 \times 10^{15}$ to $8 \times 10^{15}$ ions/cm$^2$. In this embodiment, phosphorus is used as a deep dopant with a light dose. More specifically, phosphorus is implanted with an implant energy of 10–60 keV and with a dose of $1 \times 10^{13}$ to $1 \times 10^{14}$ ions/cm$^2$.

In a third embodiment of the invention, antimony is used as the deep dopant with a high dose. More specifically, antimony is doped with an energy level of 10–60 keV and with a dose of $2 \times 10^{15}$ to $8 \times 10^{15}$ ions/cm$^2$. Phosphorus or arsenic is the shallow dopant with a light dose. More specifically, phosphorous or arsenic is implanted with an implant energy of 5–15 keV and with a dose of $1 \times 10^{13}$ to $1 \times 10^{14}$ ions/cm$^2$.

For each of the embodiments, the shallow and deep dopants may be implanted in any order. Additionally, and for each of these embodiments, a low energy doping may be alternatively performed with an energy level of 200–500 keV and a high-energy doping may be alternatively performed with an energy level of 500 eV to 1 keV. These alternative energy levels produce shallower doping profiles for each dopant. In general, the shallowest doped portion is substantially consumed in subsequent silicidation steps. Thus, the deeper doses control the drive current at the source/gate and drain/gate junctions. In general, heavier deep doses produce higher drive currents while lighter deep doses produce lower drain currents. A heavier shallow dose provides lower bulk resistance of the surface source/drain.

FIGS. 2A and 2B are partial cross sectional views of the semiconductor substrate of FIGS. 1A and 1B illustrating the formation of transistors according to the present invention during subsequent formation steps. Referring now to FIG. 2A, it may be seen that photo mask 130 of FIG. 1B has been removed and that a photo mask 202 has been formed over the n-channel device. The photo mask 202 is for protecting the n-channel device while the p-channel device is formed according to the present invention. Additionally, it may be seen that a first dopant has been implanted into the p-channel device in both the active region and the gate conductor to form doped portions 204 in the active region and doped portion 210 in the gate conductor. Additionally, a second dopant has been implanted in the active region and the gate conductor to form doped portions 206 in the active region and doped portion 208 in the gate conductor. While the doped portions 204 and 206 are shown to be separated for illustrative purposes, the doped portions 204 and 206 are not required to be separate and actually adjoin one another in some embodiments. In such cases, the doped portions 204 and 206 would adjoin one another within the active region 114B. In the same fashion, doped portions 208 and 210 may also adjoin one another.

There are several different embodiments of the doping levels and types according to the present invention. In the first embodiment, indium is implanted with an energy level of 2–10 keV and with a dose of $1 \times 10^{13}$ to $1 \times 10^{14}$ ions/cm$^2$. This doping forms shallow doped portions 206 and doped portion 208 of FIG. 2A. Boron or boron-diflouride (BF$_2$) is doped with an energy level of 5–30 keV with a dose of $2 \times 10^{15}$ to $8 \times 10^{15}$ ions/cm$^2$. This doping forms deep doped portions 204 and doped portion 210 of FIG. 2A.

In a second embodiment of the invention, BF$_2$ is used as the shallow dopant with a high dose. More specifically, BF$_2$ is implanted with an implant energy of 2–10 keV and with a dose of $2 \times 10^{15}$ to $8 \times 10^{15}$ ions/cm2. In this embodiment, boron is used as a deep dopant with a light dose. More specifically, boron is implanted with an implant energy of 5–30 keV and with a dose of $1 \times 10^{13}$ to $1 \times 10^{14}$ ions/cm$^2$.

In a third embodiment of the invention, boron or BF$_2$ is used as that the deep dopant with a high dose. More specifically, boron or BF$_2$ is doped with an energy level of 10–60 keV and with a dose of $2 \times 10^{15}$ to $8 \times 10^{15}$ ions/cm$^2$. Indium is the shallow dopant and is implanted with an implant energy of 5 keV and with a dose of $1 \times 10^{13}$ to $1 \times 10^{14}$ ions/cm$^2$. For each of the embodiments, the shallow and deep dopants may be implanted in any order. Additionally, and for each of these embodiments, and a low energy doping may be alternatively performed with an energy level of 200 to 500 keV and a high-energy doping may be alternatively performed with an energy level of 500 eV to 1 keV. These alternative energy levels produce more shallow doping profiles for each dopant.

As is understood by those skilled in the art, the molecular weights of the dopants must be considered when determining an implant energy. By way of example, phosphorus has a molecular wight of 31 while arsenic has a molecular weight of 75. Accordingly, for a given depth, the phosphorus must be implanted with an energy level that greater than that used for the implant of Arsenic. Similarly, one practicing the invention should consider the molecular weight of indium (100), boron (11) and BF$_2$ (49) when determining implant energies, especially when a range of implant energies is specified herein for a range of doping elements.

FIG. 2B is a partial cross sectional view of a semiconductor substrate illustrating the formation of a transistor according to the present invention. Referring now to FIG. 2B, it may be seen that mask 202 has been removed from protecting the n-channel device. Additionally, a silicidation metal layer 250 has been formed on top of the surface of a substrate 100. In the preferred embodiment of the invention, the silicidation metal is applied in a deposition step. More specifically, cobalt is deposited to a depth of 50 to 200 Angstroms. Alternative metals that may be used include titanium and nickel.

FIGS. 3A and 3B are partial cross-sectional views of a semiconductor substrate of FIGS. 2A and 2B illustrating the formation of a transistor according to the present invention, during subsequent formation steps. Referring now to FIG. 3A, the partial cross-sectional view of the semiconductor substrate is shown after a rapid thermal annealing has been performed in an N$_2$ ambient at a temperature of 550 to 700 degrees Celsius for a period of 30 to 60 seconds. This rapid thermal annealing step serves to initiate silicidation to cause a portion of the silicidation metal to chemically react with the silicon of the substrate 100, particularly the upper portions of the active regions 114A and 114B that have been doped. As may be seen, each of the shallow doped regions, namely, regions and 134, 136, 206 and 208 have changed chemical form as a result of the silicidation process and have become silicidation regions 302, 306, 304 and 308, respectively.

FIG. 3B is a partial cross-sectional view of a semiconductor substrate illustrating the formation of a transistor according to the present invention. Referring now to FIG. 3B, substrate 100 to shown after all unreacted silicidation metal including that which was adjacent to the transistor gate spacers 118 and 124 has been stripped away. Such stripping may be performed using the well known RCA wafer cleaning procedure.

FIG. 4 is a flow chart illustrating a first series of steps of a method for forming a transistor upon a semiconductor substrate according to the present invention. For the purposes of FIGS. 4 and 5, a process for forming a CMOS device in a p-type substrate is described. Referring now to FIG. 4, isolation regions 102A, 102B and 102C, active regions 104A and 104B (well 106) are formed in/on the substrate 100 (step 402).

After the formation of the active regions, the isolation regions, the wells and the gate structures are formed in and/or upon the active regions 104 (step 404). Gate structure 110 is formed for an n-channel device above active region 104A and gate structure 112 is formed for a p-channel device above active region 104B (well 106). The gate structures 110 formed in step 404 include a gate dielectric 114, a gate conductor 116, and spacers 118 (of FIG. 1). Similarly, gate structures 112 formed in step 404 include a gate dielectric 120, the gate conductor 122, and spacers 124.

Generally, gate structures are formed by first forming a dielectric layer and then forming a gate conductor layer thereupon. The dielectric layer may be grown or deposited and has a thickness commensurate with the width of the channel. The gate conductor layer is, in one embodiment, formed of polysilicon that is deposited in a Low Pressure Chemical Vapor Deposition (LPCVD) step or another step that is known in the art. After the gate conductor layer is formed upon the substrate 100, it is often subjected to a chemical-mechanical polish ("CMP") process. CMP is a popular interlevel dielectric removal process used for its ability to planarize the resulting surface. Then, the polysilicon and gate dielectric layers are pattern masked and isotropically etched to form the gate structures 110 and 112.

Other optional processing may also be performed upon substrate 100. For example, Vt implants or LDD regions may be formed below be gate conductors or below the spacers, respectively. Additionally, punch through regions may be formed across the active regions 104A and 104B as well. One skilled in the art can readily appreciate and understand the inclusion of these formations without additional explanation.

After the gate structures are formed, a photo mask 130 is formed over the p-channel devices of substrate 100 (step 406). More specifically, photo mask 130 is formed over a portion of the center isolation region 102B, over well 106, gate structure 112, and over isolation region 102C. The purpose of photo mask 130 is to shield the p-channel devices while processing steps are performed for the n-channel devices. In general, a photo mask 130 is placed over the n-channel devices while the p-channel devices are being formed and over the p-channel devices while the n-channel devices are being formed.

The photo mask 130 is formed by depositing a photoresist across the exposed surface of the substrate. The portion of the substrate that is not to be protected is then exposed using a photolithography step. Then, the exposed portions of the photoresist are stripped in an ashing process. Of course, the patterned mask 130 may be formed using other techniques as well. Once the patterned mask is formed, the unprotected portion of the dielectric layer is etched.

After the mask is formed over the p-channel devices and the exposed portions of the mask have been removed from the n-channel devices, a first dopant is implanted into the n-channel device in the active region and the gate conductor to form doped portions 132 in the active region and doped portion 138 in the gate conductor (step 408). Additionally, a second dopant is implanted in the active region and the gate conductor to form doped portions 134 in the active region and doped portion 136 in the gate structure conductor (step 410). There are several different embodiments of the doping levels and types according to the present invention. These embodiments were described above with reference to FIGS. 1A–1D, 2A–2D and 3A–3D.

After the first and second dopants have been implanted into the n-channel devices, photo mask 130 of FIG. 1 is removed (step 412) and a photo mask 202 is formed over the n-channel devices (step 414). As discussed before, photo mask 202 is for protecting the n-channel devices while the p-channel devices are formed according to the present invention.

Figure 5:
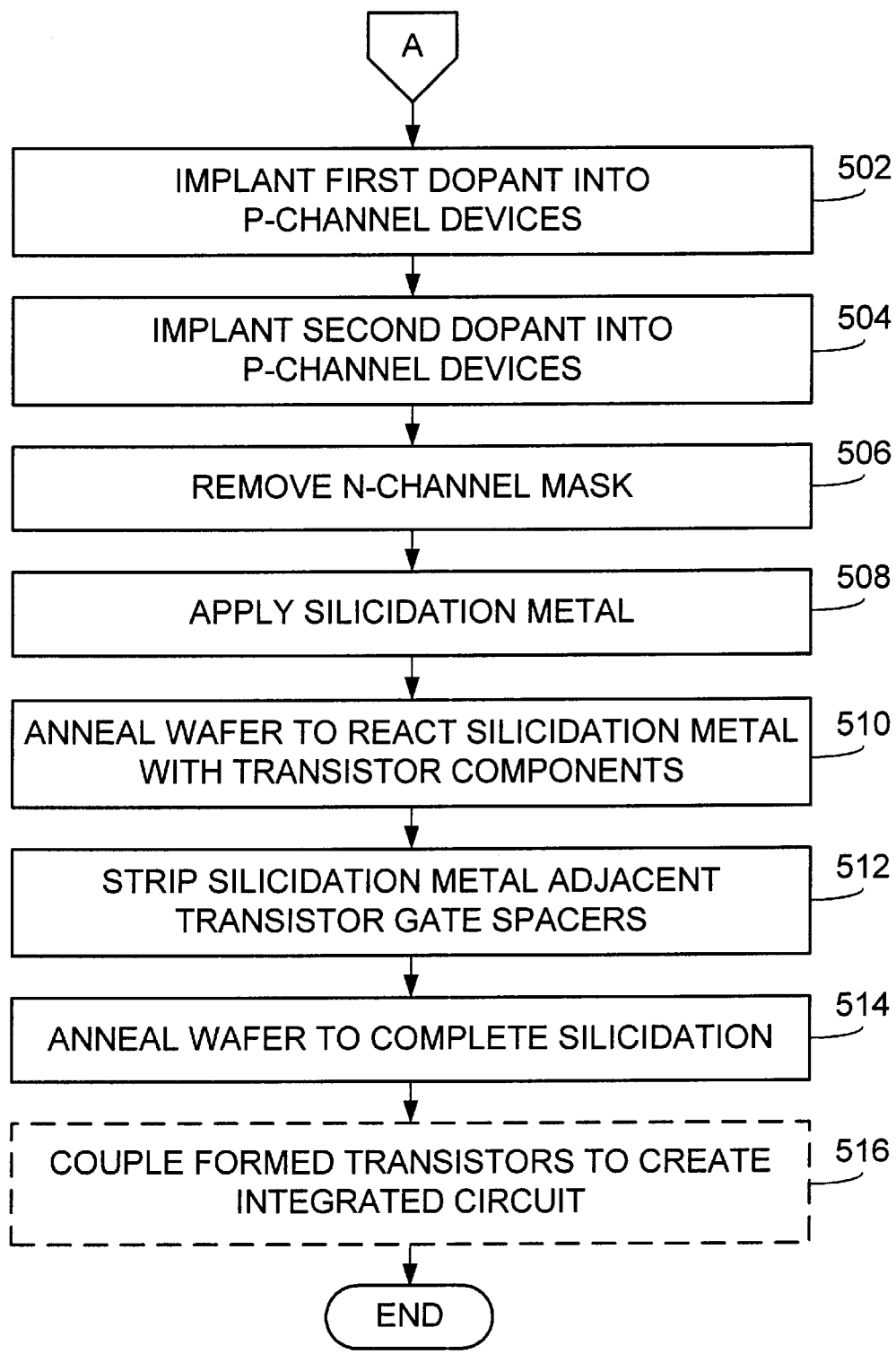
FIG. 5 is a flow chart illustrating a second series of steps of a method for forming a transistor upon a semiconductor substrate according to the present invention.

Referring now to FIG. 5, a first dopant is implanted into the p-channel device in the active region and the gate conductor to form doped portions 204 in/on the active region and doped portion 210 in the gate conductor (step 502). Additionally, a second dopant is implanted in the active region and the gate conductor to form doped portions 206 in the active region and doped portion 208 in the gate structure conductor (step 504). As was previously described, there are several different embodiments of the doping levels and doping types according to the present invention.

After the doping steps are performed, mask 202 is removed from the substrate 100 (step 506). Thereafter, a silicidation metal layer is formed on top of the surface of a substrate 100 (step 508). In one embodiment of the invention, the silicidation metal is applied in a deposition step. More specifically, cobalt is deposited to a depth of 15 to 200 Angstroms. Alternative metals that may be used include titanium and nickel. After the silicidation metal is formed on the substrate 100, a rapid thermal annealing is performed in an $N_2$ ambient having a temperature of 550 to 700 degrees Celsius for a period of 30 to 60 seconds (step 510). This rapid thermal annealing step serves to initiate silicidation and to cause a portion of the silicidation metal to chemically interact with the silicon on top of substrate 100. As may be seen, each of the shallow doped regions, namely, regions and 134, 136, 206 and 208 have changed chemical form as a result of the silicidation process and have become silicidation regions 302, 306, 304 and 308.

After the annealing step, all un-reacted silicidation metal including that which was adjacent to the transistor gate spacers is removed (step 512). In general, the silicidation metal does not react with insulative materials and more particularly, with isolation regions and with gate spacers. After the un-reacted silicidation metal is removed, the substrate is annealed an additional amount to complete silicidation if necessary (step 514). At this point, the device as described herein is complete. Thus, the final step is to connect the various devices of substrate 100 to form the integrated circuit (step 516).

Figure 6:
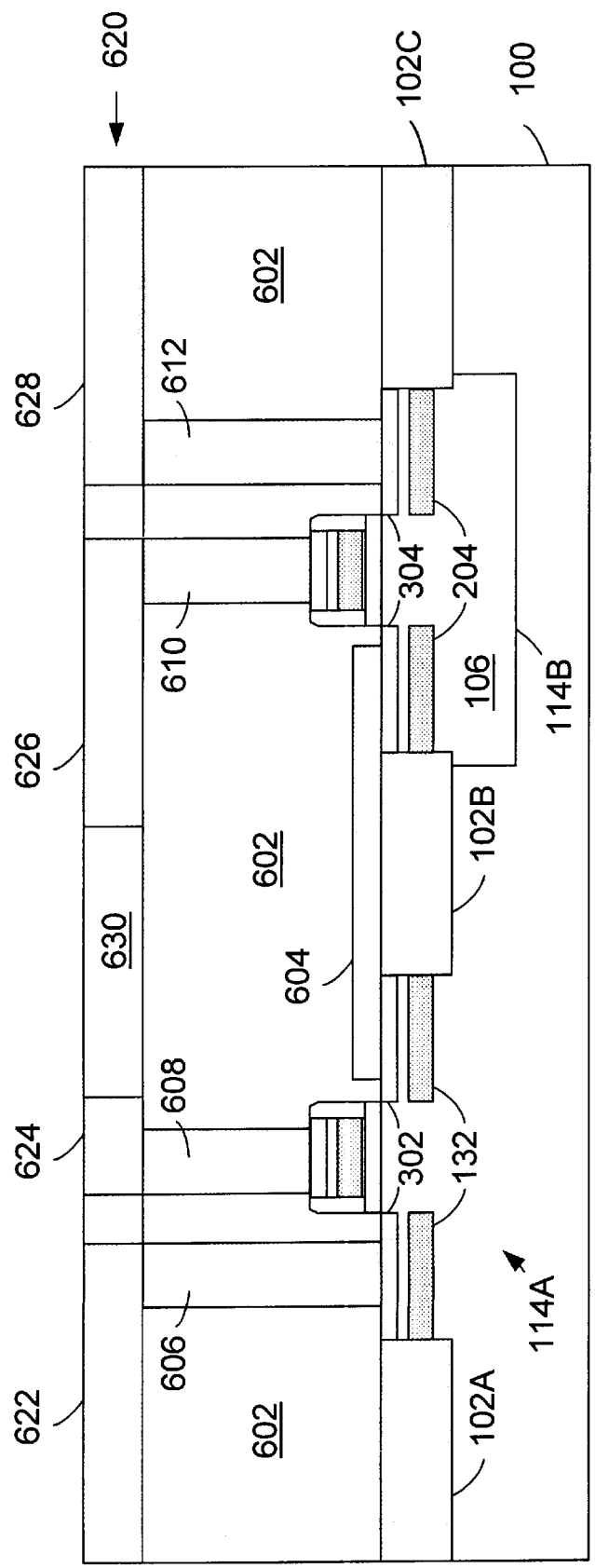
FIG. 6 is a partial cross sectional diagram of a transistor that has been formed according to the present invention that illustrates in detail the components of the transistor and how the transistor can be connected to other transistors to form an integrated circuit.

FIG. 6 is a partial cross sectional diagram of a transistor which has been formed according to the present invention and that illustrates in detail the components of the transistor and how the transistor can be connected to other transistors to form an integrated circuit. Referring now to FIG. 6, each of the components as discussed previously include the part numbers used to introduce the components. More specifically, the CMOS transistor pair may be seen, the transistor pair including the doped source and drain regions 132 and 204 as well as the silicides 302 and 304. Additionally, the isolation regions 102A, 102B and 102C and the active region 104A and 104B (well 106) are shown in FIG. 6.

After each of these aforementioned elements has been formed, a local interconnect 604 may be formed, e.g., a metal strip that connects adjacent junctions. Then, an insulation layer 602 is formed. Insulation layer 602 may be formed of a silicon dioxide or other insulator that is deposited on the substrate and optionally planarized in a CMP process.

Openings in the substrate are then formed to create vias of the integrated circuit for subsequent connection to other devices through the metallization layers. Once the openings are formed, a sputtering, deposition or evaporation process, by way of example, is used to fill the vias with a metal. The resulting metallized vias 606, 608, 610 and 612 are formed. Metals that can be used in this process include Ti, TiN, W and Al. The vias 606, 608, 610, and 612 may be deposited in a same step that forms metallization layer 620. The metallization layer 620 is then masked to form a conductor pattern and is etched back to the insulation layer 608 to form the conductors 622, 624, 626 and 628. An insulation layer 630 may be formed to isolate conductive paths 622, 624, 626 and 628 formed in the metallization layer 620, particularly if a subsequent metallization layer is formed upon the metallization layer 620. Subsequent metallization layers (not shown) can provide further interconnections among the devices and external to the formed integrated circuit.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:

1. A method for forming a transistor in an active region of a substrate, the method comprising:

forming a gate structure upon the active region, the gate structure having a gate dielectric and a gate conductor;

implanting a first dopant at a first implant depth and at a first implant dose to form first source and drain implants;

implanting a second dopant at a second implant depth and at a second implant dose to form second source and drain implants, the second implant depth greater than the first implant depth;

wherein implanting the first dopant also forms a first doped gate conductor portion;

wherein implanting the second dopant also forms a second doped gate portion;

depositing a silicidation metal layer;

reacting the silicidation metal layer with the first source and drain implants to form source and drain silicidation regions, the source and drain silicidation regions substantially consuming the first source and drain implants, respectively; and removing unreacted portions of the silicidation metal layer.

2. The method of claim 1, wherein the step of forming the gate structure includes the step of forming spacers about the gate conductor.

3. The method of claim 1, wherein reacting the silicidation metal layer is performed in an annealing step.

4. The method of claim 1, wherein in reacting the silicidation metal layer, the first doped gate conductor portion is converted to a silicide.

5. The method of claim 4, wherein in reacting the silicidation metal layer, the second doped gate conductor portion is also converted to a silicide.

6. The method of claim 1, wherein:

the active region is p-type; and the first dopant comprises one of arsenic, antimony or phosphorus.

7. The method of claim 6, wherein:

the second dopant comprises one of arsenic, antimony or phosphorus; and the second dopant is different from the first dopant.

8. The method of claim 1 wherein:

the active region is n-type; and the first dopant comprises one of indium, boron or $BF_2$.

9. The method of claim 8, wherein:

the second dopant comprises one of indium, boron or $BF_2$; and the second dopant is different from the first dopant.

10. The method of claim 1, wherein:

the first dopant is implanted at a heavy dose; and the second dopant is implanted at a light dose.

11. The method of claim 10, wherein:

the heavy dose is in the range from $2 \times 10^{15}$ to $8 \times 10^{15}$ ions/cm$^2$; and the light dose is in the range from $1 \times 10^{13}$ to $1 \times 10^{14}$ ions/cm$^2$.

12. The method of claim 1, wherein:

the first dopant is implanted at a light dose; and the second dopant is implanted at a heavy dose.

13. The method of claim 12, wherein:

the light dose is in the range from $1 \times 10^{13}$ to $1 \times 10^{14}$ ions/cm$^2$; and the heavy dose is in the range from $2 \times 10^{15}$ to $8 \times 10^{15}$ ions/cm$^2$.

14. The method of claim 1, wherein the silicidation metal layer is formed of one of cobalt, titanium or nickel.

15. The method of claim 1, further comprising:

forming a voltage threshold region in the active region below the gate dielectric.

16. The method of claim 1, wherein a plurality of transistors are formed according to the above-described steps, and further comprising:

intercoupling the plurality of transistors to form an integrated circuit.

17. The method of claim 1, wherein:

a plurality of n-type transistors are formed according to the above-described steps; and a plurality of p-type transistors are formed according to the above-described steps but using different dopants.

18. The method of claim 17, wherein the plurality of n-type transistors and the plurality of p-type transistors are coupled to form complementary metal oxide silicon transistors.

19. The method of claim 1, wherein:

the first dopant is implanted at an energy between 2 keV and 10 keV; and the second dopant is implanted at an energy between 5 keV and 30 keV.

20. The method of claim 1, wherein:

the first dopant is implanted at an energy between 5 keV and 15 keV; and the second dopant is implanted at an energy between 10 keV and 60 keV.

21. The method of claim 1, wherein:

the first dopant is implanted at an energy between 200 eV and 500 eV; and the second dopant is implanted at an energy between 500 eV and 1 keV.

* * * * *